United States Patent [19]

Bendernagel et al.

[11] Patent Number: 5,159,429

[45] Date of Patent: Oct. 27, 1992

[54] SEMICONDUCTOR DEVICE STRUCTURE EMPLOYING A MULTI-LEVEL EPITAXIAL STRUCTURE AND METHOD OF MANUFACTURING SAME

[75] Inventors: Robert E. Bendernagel, Carmel; Kyong-Min Kim; Victor J. Silvestri, both of Hopewell Junction; Pavel Smetana, Poughkeepsie; Thomas H. Strudwick, Wappingers Falls; William H. White, Poughkeepsie, all of N.Y.

[73] Assignee: International Business Machines Corporation, Armonk, N.Y.

[21] Appl. No.: 884,318

[22] Filed: May 11, 1992

Related U.S. Application Data

[60] Continuation of Ser. No. 685,109, Apr. 15, 1991, abandoned, which is a division of Ser. No. 468,533, Jan. 23, 1990, Pat. No. 5,061,652.

[51] Int. Cl.$^5$ ............................................. H01L 27/04
[52] U.S. Cl. ...................................... 357/50; 357/41; 357/43; 357/48; 357/49
[58] Field of Search ...................... 357/49, 41, 48, 50, 357/43

[56] References Cited

U.S. PATENT DOCUMENTS

| | | | |
|---|---|---|---|
| 3,547,716 | 12/1970 | DeWitt | 357/49 |
| 3,550,260 | 12/1970 | Saltich et al. | 29/567 |
| 3,585,464 | 6/1971 | Castrucci et al. | 317/235 |
| 3,607,465 | 9/1971 | Froulin | 148/175 |
| 3,656,028 | 4/1972 | Langdon | 317/235 R |
| 3,721,588 | 3/1973 | Hays | 148/175 |
| 3,769,105 | 10/1973 | Chen et al. | 148/175 |
| 3,772,097 | 11/1973 | Davis | 148/175 |
| 3,775,196 | 11/1973 | Wakamiya et al. | 148/175 |
| 3,912,555 | 10/1975 | Tsuyuki | 148/175 |
| 3,929,526 | 12/1975 | Nuttall et al. | 148/175 |
| 4,104,086 | 8/1978 | Bondur et al. | 148/1.5 |
| 4,142,925 | 3/1979 | King et al. | 148/175 |
| 4,157,269 | 6/1979 | Ning et al. | 148/1.5 |
| 4,160,991 | 7/1979 | Anantha et al. | 357/49 |
| 4,168,997 | 9/1979 | Compton | 147/175 |
| 4,191,602 | 3/1980 | Baliga | 148/171 |
| 4,252,582 | 2/1981 | Anantha et al. | 148/175 |
| 4,307,180 | 12/1981 | Pogge | 430/314 |
| 4,319,932 | 3/1982 | Jambotkar | 148/1.5 |
| 4,745,081 | 5/1988 | Beyer et al. | 437/38 |
| 4,752,817 | 6/1988 | Lechaton et al. | 357/50 |
| 4,926,231 | 5/1990 | Hwang et al. | 357/49 |
| 4,936,928 | 6/1990 | Shaw et al. | 148/33.4 |

FOREIGN PATENT DOCUMENTS 0224717 6/1987 European Pat. Off.
0099254 4/1989 Japan.

OTHER PUBLICATIONS

Ang et al., "Growth and Characterization of Germanium and Boron Doped Silicon Epitaxial Films", Journal of Electronic Materials vol. 17, No. 1, 1988, pp. 39–43.

*Primary Examiner*—Edward J. Wojciechowicz
*Attorney, Agent, or Firm*—Harold Huberfeld; Jeffrey L. Brandt

[57] ABSTRACT

A semiconductor structure including a doped semiconductor substrate defining a surface. A buffer layer of epitaxial semiconductor material overlies the substrate surface, the buffer layer having a relatively higher dopant concentration than the substrate and being virtually free from oxygen precipitation. A layer of intrinsic semiconductor material overlies the buffer layer, and a device layer of epitaxial semiconductor material is situated on the intrinsic layer. The device layer is formed to have a relatively lower dopant concentration than the first layer. Isolation regions extend from a surface of the device layer into the buffer layer for forming an electrically isolated device region in the device layer. At least one active device is formed in the isolated device region.

6 Claims, 2 Drawing Sheets

SEMICONDUCTOR DEVICE STRUCTURE EMPLOYING A MULTI-LEVEL EPITAXIAL STRUCTURE AND METHOD OF MANUFACTURING SAME

This application is a continuation of application Ser. No. 07/685,109 filed Apr. 15, 1991, now abandoned, which is a division of 07/468533 filed Jan. 23, 1990 now U.S. Pat. No. 5,061,652.

The present invention relates generally to semiconductor devices and more particularly to a semiconductor device structure incorporating a multilevel structure including a highly doped buffer layer, and a method of manufacturing the same.

BACKGROUND OF THE INVENTION

Referring to FIGS. 1 and 2, typical semiconductor structures utilize a relatively highly doped P+ 10 (FIG. 1) or N+ 12 (FIG. 2) substrate having, for example, a dopant concentration generally higher than $10^{17}$ atoms/cubic centimeter. Substrates 10 and 12 are formed using a conventional crystal pulling process so as to have a surface orientation of, for example, <100>, <110>, or <111>.

As shown in FIG. 1, a relatively lightly doped P− epitaxial layer 13 is formed on substrate 10, and isolation regions 14 of an insulating material are formed from the surface of layer 13 downward into layer 10 to form an isolated device region 15

FIG. 2 shows the same type of isolated device region 22 formed in a lightly doped N− epitaxial layer 20. Prior to the growth of lightly doped epitaxial layers 13 or 20, a protective capping layer 16 of silicon dioxide is formed on the backside of the substrate to prevent autodoping of the epitaxial layer by the substrate.

Subsequent to the formation of the structures shown in FIGS. 1 and 2, passive devices such as resistors (not shown), and/or active devices (not shown) such as bipolar transistors, field-effect transistors, BICMOS circuits, or integrated circuits are formed in the isolated device regions 15, 22. The formation of these active devices typically includes the formation of multiple doped regions (not shown) within the epitaxial layers 13, 20 of device regions 15 and 22. Many different transistor and device structures, and methods for forming the same, are well known in the art and need not be described here in detail.

The above-described processes and structures suffer from several disadvantages, including: 1) a difficulty in controlling the dopant profiles of the substrates which is well-recognized and endemic in the formation of liquid grown, large crystalline substrates; 2) a similar, endemic inability to control oxygen and other impurities in the substrates; 3) the extra process steps required to form a capping layer such as silicon dioxide or silicon nitride on the substrate back surface; and 4) warping of the substrate caused by such a capping layer.

U.S. Pat. No. 3,585,464 to Castrucci et al. (assigned to the assignee of the present invention) shows a different semiconductor device structure wherein an epitaxial N layer is formed on a P− substrate. Active devices are subsequently formed in isolated regions of the N layer. The forming of the device-containing layer directly on the lightly doped substrate results in the disadvantage of less than optimal electrical isolation between isolated device regions.

U.S. Pat. No. 3,721,588 to Hays shows a method wherein a lightly doped substrate 10 is used to support a first highly doped epitaxial layer 11. In contrast to the present invention, however, the Hays patent teaches the removal of the substrate and the first epitaxial layer to leave a thin, second epitaxial silicon layer supported on an insulator.

SUMMARY OF THE INVENTION

An object of the present invention is to provide a new and improved semiconductor structure which can be beneficially utilized in the formation of active fabricating the same.

Another object of the present invention is to provide such a structure and process wherein improved electrical isolation is provided between isolated device regions.

A further object of the present invention is to provide such a structure and process wherein the doping concentration profile of the device regions can be very closely controlled.

An additional object of the present invention is to provide such a structure and process wherein the oxygen and other impurities in the device regions can be minimized so as to reduce electrical defects.

Yet another object of the present invention is to provide such a structure and process which is compatible with existing semiconductor processes.

Yet a further object of the present invention is to provide such a structure and process which requires less processing steps and hence which is more economical than the prior art.

In accordance with the present invention, there is provided a new and improved semiconductor structure comprising: a doped semiconductor substrate including a surface; a first layer of epitaxial semiconductor material on the substrate surface having a relatively higher dopant concentration than the substrate; a second layer of epitaxial semiconductor material on the first layer, the second layer having a relatively lower dopant concentration than the first layer; and isolation means including a region of insulating material extending from a surface of the second layer into the first layer for electrically isolating a device region in the second layer.

In accordance with another embodiment of the present invention, there is provided a new and improved method of forming a semiconductor structure comprising the steps of: providing a doped semiconductor substrate including a surface; epitaxially growing a first layer of semiconductor material on the substrate surface, the first layer having a relatively higher dopant concentration than the substrate; epitaxially growing a second layer of semiconductor material on the first layer, the second layer having a relatively lower dopant concentration than the first layer; forming isolation means including a region of insulating material extending from a surface of the second layer into the first layer for electrically isolating a device region in the second layer

BRIEF DESCRIPTION OF THE DRAWINGS

These and other objects, features and advantages of the present invention will become apparent upon a consideration of the following detailed description of the invention when read in conjunction with the drawing Figures, in which.

DETAILED DESCRIPTION OF THE INVENTION

Figure 3:
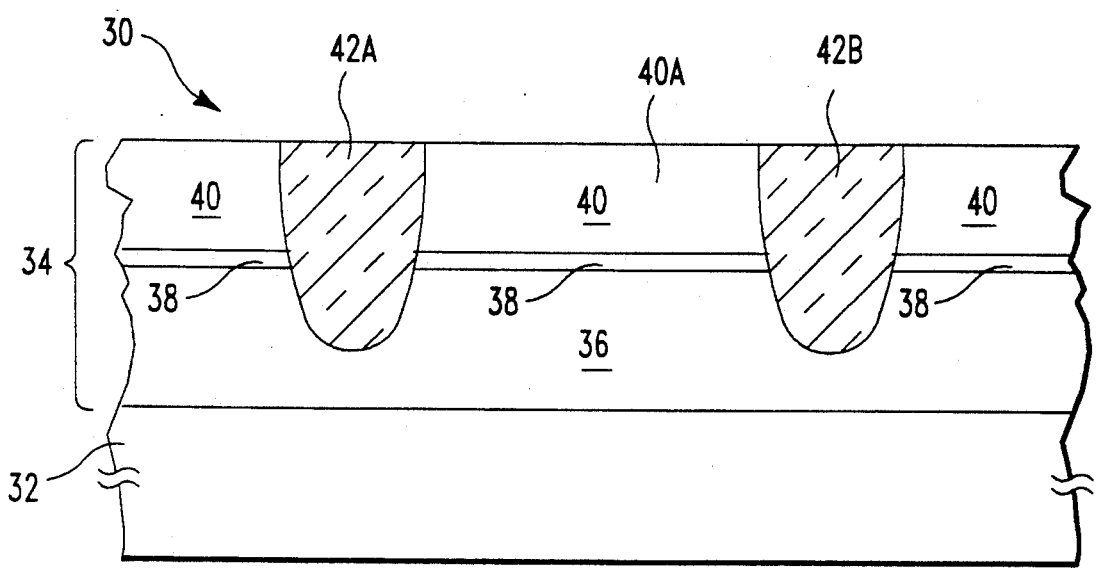
FIG. 3 shows a cross-sectional view of a semiconductor structure constructed in accordance with the present invention.

Referring now to FIG. 3, a silicon semiconductor structure 30 formed in accordance with the present invention includes a substrate 32 defining a generally planar surface overlain by a multilevel, silicon epitaxial structure 34. Substrate 32 comprises a conventional silicon crystal formed by a conventional, liquid growth crystal pulling process to form, for example, a <100>, <110>, or <111> crystallographic orientation.

Substrate 32 is doped in a conventional manner during the manufacturing process with either a P or N type dopant to a concentration in the range of from $10^{14}$–$10^{19}$ dopant atoms per cubic centimeter (atoms/cc). A typical, preferred concentration for substrate 32 is less than $10^{17}$ atoms/cc Dependent on the dopant concentration, substrate 32 will contain an inherent oxygen concentration in the range of about 3–40 interstitial oxygen atoms per million silicon atoms (ppma) (ASTM F121-79). It will be appreciated that, when the doping concentration of substrate 32 is kept relatively light, i.e. in the preferred range below about $10^{17}$ atoms/cc, the oxygen concentration in the substrate can be easily measured and controlled.

In accordance with a main feature of the present invention, epitaxial structure 34 comprises a highly doped P+ or N+ epitaxial buffer layer 36 formed on substrate 32. Layer 36 is formed to a thickness in the range of about 0.4–20 micrometers, and to a doping concentration in the range of $10^{17}$–$10^{20}$ atoms/cc. Typical thicknesses and dopant concentrations for layer 36 are about 12 micrometers and $10^{19}$ atoms/cc, respectively.

Epitaxial structure 34, including layer 36 and subsequently formed layers 38 and 40 (described below), is formed using conventional processes and tools in the manner described below. Epitaxial layers 36, 38, and 40 are grown at a temperature in the range of 850–1200 degrees centigrade and at a growth rate of about 0.1–6.0 microns/minute A typical temperature and growth rate comprises, for example, 1130 degrees centigrade and 2 microns/minute, respectively.

In a manner well understood in the art, the growth rate is dependent upon such factors as the silicon source species (e.g. $SiH_xCl_y$ or $SiH_4$), the reactor main flow rate and geometry, and the selected deposition temperature. Similarly, as is well understood in the art, the dopant concentration within the reactor is selected to provide the desired, resultant substrate concentration, and is dependent on the layer growth rate and the dopant specie incorporation rate into the grown layer.

It is noted at this point that, in accordance with another embodiment of the present invention, buffer layer 36 can beneficially be doped with Group IV impurity atoms such as germanium (Ge). See, for example, Ang et al., "Growth and Characterization of Germanium and Boron Doped Silicon Epitaxial Films", Journal of Electron Materials, Vol. 17, No. 1, 1988, pgs. 39–43, incorporated herein by reference, for a discussion of germanium doping of epitaxial silicon Such impurity doping, when performed to a ratio of about 1:10, dopant:species, provides the significant advantage of reducing wafer distortion by matching lattice constants. This results in substantially decreased wafer warpage and a concomitant decrease in electrical defects.

Subsequent to the formation of layer 36, device 30 is subjected to a cleaning, for example utilizing a conventional hydrogen cleaning process (i.e. an $H_2$ flush) or an HCl vapor etch.

Epitaxial silicon layer 38 is formed over layer 36 to a thickness in the range of 0.0–2.0 microns and an intrinsic dopant concentration of less than $10^{15}$ atoms/cc. A typical thickness for layer 38 is on the order of about 0.4 micrometers, while the dopant concentration is preferably intrinsic i.e. maintained as low as possible by avoiding deliberate doping. As will be discussed in further detail below, layer 38 comprises an optional feature of the present invention.

The device is subjected to a cleaning process of the above-described type, and a layer 40 of N or P type doped epitaxial silicon is formed over layer 38. Layer 40 is formed to a thickness in the range of 0.4–10 micrometers, and a concentration in the range of $10^{15}$–$10^{17}$ atoms/cc A typical thickness and dopant concentration for layer 40 comprises 2.0 microns and $10^{16}$ atoms/cc, respectively. As is described in further detail below, layer 40 comprises the device-supporting layer.

Isolating regions 42A, 42B are formed in structure 30, extending from the upper surface of layer 40 and terminating in layer 36. It is an important feature of the present invention that isolating regions 42A and 42B terminate in highly doped layer 36, and do not extend into substrate 32 as is commonly practiced in the prior art. In a manner well known in the art, isolating regions 42A, 42B can, for example, comprise portions of a circular or rectangular isolation structure so as to circumscribe an isolated device region 40A in layer 40.

Discussing in detail the construction of isolation regions 42A, 42B, these isolation regions can comprise, for example, multi-layer insulating materials in the manner shown and described in U.S. Pat. Nos. 4,104,086 or 4,307,180, each of which is assigned to the assignee of the present invention and incorporated herein by reference. , In accordance with another feature of the present invention, isolation regions 42A, 42B can be formed such that selected ones of the regions provide an electrical connection to layer 36. Such selected isolation regions include insulating sidewalls, open bottoms (i.e. the insulating sidewalls do not extend to the region/trench bottoms), and a conductive filler such as polysilicon. The details of one such structure are taught, for example, in U.S. Pat. No. 4,745,081, assigned to the assignee of the present invention and incorporated herein by reference Alternatively, electrical connection to layer 36 can be made by the use of a heavily doped silicon region, formed by high temperature diffusion processing, in a manner well known in the art.

Isolation trenches 42A, 42B thus define isolated device region 40A within layer 40 wherein active devices and/or inactive devices are subsequently formed.

Figure 1:
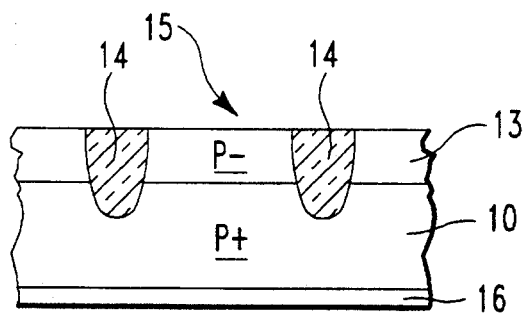
FIG. 1 shows a cross-sectional view of a semiconductor structure constructed in accordance with the prior art in a manner described above.
Figure 2:
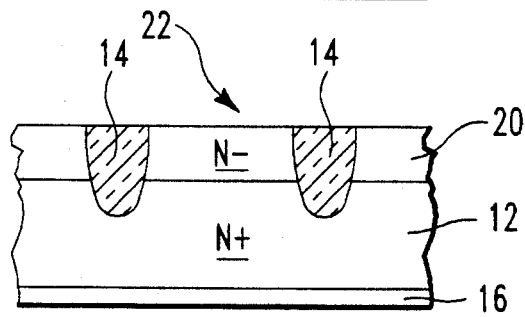
FIG. 2 shows a cross-sectional view of a semiconductor structure constructed in accordance with the prior art in a manner described above.

Considering the above-described semiconductor structure 30 (FIG. 3) and the method of making the same, several advantages of the present invention are immediately appreciated. The doping concentrations of vapor grown, epitaxial layers 36, 38 and 40 can be very closely controlled. These same epitaxial layers contain virtually no oxygen precipitates. When the preferred, high-resistivity substrate is used, the interstitial oxygen in the substrate is more readily measured and controlled than with more highly doped substrates. This results in fewer electrical defects in the substrate. The electrical isolation of isolated device region 40A is very good because of the isolating effect of highly doped layer 36. Further, the step of forming the silicon dioxide capping layer (16 of FIGS. 1 and 2), and the warpage and extra process steps associated therewith, is avoided. Yet a further advantage of the present invention is the tendency of heavily doped layer 36 to absorb alpha particles, minimizing the sensitivity of devices formed in structure 30 to alpha particle radiation.

Figure 4:
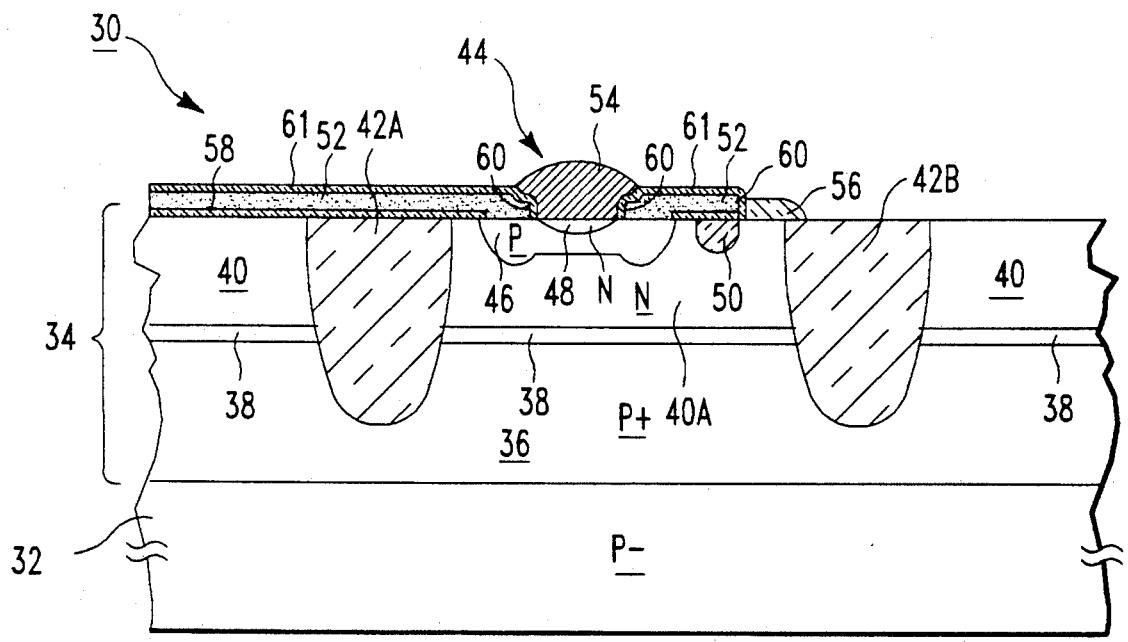
FIG. 4 shows a cross-sectional view of a semiconductor structure constructed in accordance with the present invention and including a vertical, NPN bipolar transistor fabricated in a device region thereof.

Referring now to FIG. 4, the semiconductor structure 30 of FIG. 3 is shown supporting a vertical NPN transistor 44 in isolated device region 40A. For purposes of example, substrate 32 and epitaxial layers 36, 38, and 40 are formed so as to have dopant concentrations of: $10^{16}$ P type, $10^{19}$ P type, undoped, and $10^{16}$ N type, respectively.

Transistor 44 includes a P type base region 46 extending from the surface of region 40A into the region, and an N type emitter region 48 extending from the same surface into the base region. A shallow insulating region 50 is positioned in the surface of region 40A intermediate base region 46 and isolation region 42B.

Electrical contacts to transistor 44 include a polysilicon base contact 52 to the extrinsic edges of base region 46, a metal or polysilicon emitter contact 54 to emitter region 48, and a metal or polysilicon collector contact 56 to a portion of region 40A adjoining isolation region 50. A thin layer of insulating material 58, for example a stack of silicon nitride over silicon oxide, separates contact 52 from structure 30 excepting where physical contact is made to base region 46. Insulating sidewalls 60, for example comprising silicon dioxide, silicon nitride, or a stack of these two materials, cover and insulate the vertical walls of contacts 52. An insulating overlay 61, again comprising, for example, silicon dioxide, silicon nitride, or a multilayer stack of the same, overlies the upper surface of extrinsic base contact 52.

Many methods of forming the structure of transistor 44 are known to those skilled in the art, including such methods as those shown in U.S. Pat. Nos. 4,319,932, 4,160,991, 4,157,269, 4,252,582. Each of these patents is assigned to the assignee of the present invention and incorporated herein by reference.

Figure 5:
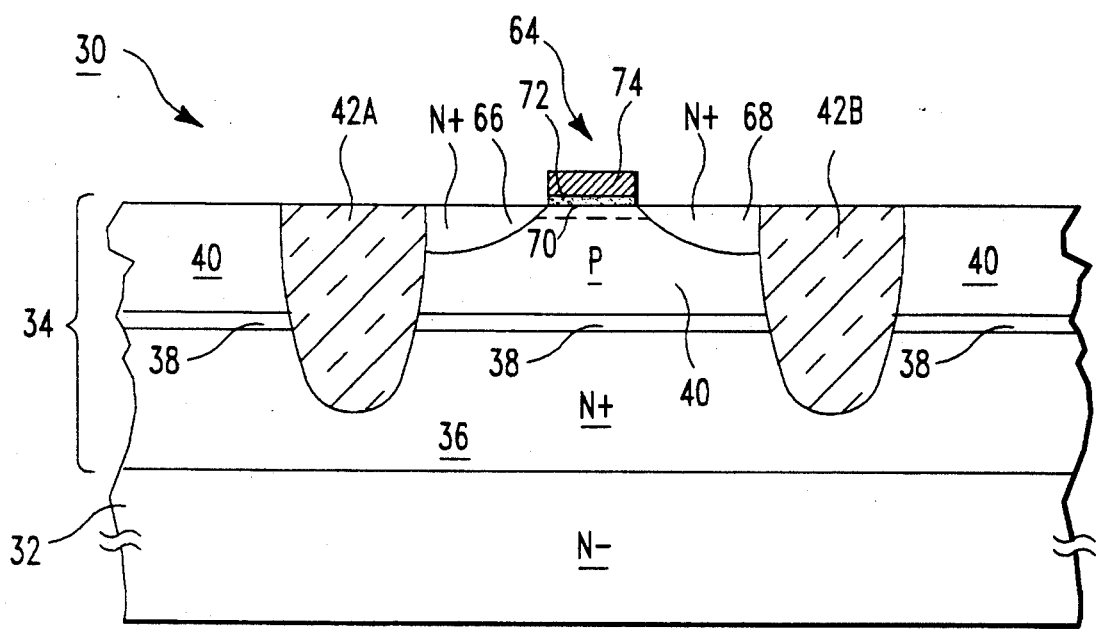
FIG. 5 shows a cross-sectional view of a semiconductor structure constructed in accordance with the present invention and including a P-channel field effect transistor fabricated in a device region thereof.

Referring now to FIG. 5, another embodiment of the present invention is shown wherein an insulated gate, or field-effect transistor (FET) 64 is shown formed in isolated device region 40A. For purposes of example, substrate 32 and epitaxial layers 36, 38, and 40 are formed so as to have dopant concentrations of: $10^{16}$ P type, $10^{18}$ N type, undoped, and $10^{16}$ P type, respectively.

FET 64 includes highly doped, N+ source and drain regions 66, 68, respectively, in the surface of isolated device region 40A. These source and drain regions 66 and 68 are spaced by a channel region 70 in layer 40. Channel region 70 is positioned underneath a gate structure comprising a conductive gate electrode 74 spaced from the channel by a thin layer of insulating material 72. Electrode 74 can comprise, for example, metal or doped polysilicon, while insulating layer 72 can comprise, for example, silicon dioxide. Many methods are known in the art for forming FET 64 and similar field-effect transistor structures, and need not be detailed herein.

It will be appreciated that the exact method of forming a semiconductor device such as bipolar transistor 44 (FIG. 4) or FET 64 (FIG. 5) does not comprise a main aspect of the present invention. The benefits of the present invention are achieved through the use of semiconductor structure 30, with active and/or passive (not shown) devices formed in isolated device region 40A. Because structure 30 exhibits the above-described advantages of well-controlled doping profiles, low defects and impurities, and good electrical isolation of the isolated device regions, devices formed within these isolated device regions exhibit or benefit from concomitant advantages.

The doping concentrations and profiles of devices formed in isolated device region 40A of structure 30 are capable of highly accurate control. The lack of defects and impurities in structure 30 provides for high performance, high yield, high reliability devices. The good electrical isolation of the isolated device regions results in devices having improved operating characteristics.

It will be understood that intrinsic layer 38, while desirable in that it minimizes autodoping from highly doped buffer layer 36 into device layer 40, is not necessary to the practice of the present invention. The advantages of the invention can be achieved through the use of substrate 32 in combination with the multilevel epitaxial layers including highly doped layer 36 and layer 40 in which the devices are formed.

There is thus provided a new and improved semiconductor device structure including a substrate overlain by a multilevel epitaxial structure including a first, highly doped epitaxial layer, and a second, device-supporting layer. The invention has application in the formation of semiconductor devices, and particularly in the field of very large scale integrated (VLSI)- and ultra large scale integrated (ULSI) circuit semiconductor device manufacturing.

While the present invention has been shown and described with respect to specific embodiments, it will be understood that it is not thus limited. Numerous modifications, changes, and improvements will occur which fall within the scope and spirit of the invention.

What is claimed is:

1. A semiconductor structure comprising:
   a doped semiconductor substrate including a surface;
   a first layer of epitaxial semiconductor material on said substrate having a relatively higher dopant concentration than said substrate;
   a second layer of intrinsic epitaxial semiconductor material on said first layer;
   a third layer of epitaxial semiconductor material on said second layer, said third layer having a relatively lower dopant concentration than said first layer;
   isolation means surrounded by said first, second and third layers and extending from a surface of said third layer into said first layer and terminating entirely in said first layer for forming an electrically isolated device region in said third layer; and at least one active device formed in said isolated device region.

2. The structure of claim 1 wherein said active device comprises a bipolar or an insulated gate transistor.

3. The structure of claim 1 wherein:
said substrate has a dopant concentration in the range of $10^{14}$–$10^{19}$ atoms/cubic centimeter;

said first layer has a thickness in the range of 0.4–20 microns and a dopant concentration in the range of $10^{17}$–$10^{20}$ atoms/cubic centimeter; and said second layer has a thickness of less than 2 microns and a dopant concentration less than the dopant concentration of said third layer;

said third layer has a thickness in the range of 0.4–10 microns and a dopant concentration in the range of $10^{15}$–$10^{17}$ atoms/cubic centimeter 4. The structure of claim 1 wherein said substrate has a dopant concentration of less than $10^{17}$ atoms/cc.

5. The structure of claim 1 wherein said substrate and said first, second, and third layers each includes silicon.

6. The structure of claim 5 wherein said first layer is doped with Group IV impurity atoms.

* * * * *